(12) United States Patent
Kawaguchi et al.

(10) Patent No.: US 12,584,220 B2
(45) Date of Patent: Mar. 24, 2026

(54) SHOWERHEAD AND SUBSTRATE PROCESSING APPARATUS

(71) Applicant: Tokyo Electron Limited, Tokyo (JP)

(72) Inventors: Takuya Kawaguchi, Yamanashi (JP); Takanobu Hotta, Yamanashi (JP); Kensaku Narushima, Yamanashi (JP); Hideaki Yamasaki, Yamanashi (JP); Takashi Kakegawa, Yamanashi (JP); Toshio Takagi, Yamanashi (JP); Takaya Yamauchi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 711 days.

(21) Appl. No.: 17/805,066

(22) Filed: Jun. 2, 2022

(65) Prior Publication Data

US 2022/0396876 A1     Dec. 15, 2022

(30) Foreign Application Priority Data

Jun. 10, 2021     (JP) ................................. 2021-097606

(51) Int. Cl.
*C23C 16/455*        (2006.01)
*C23C 16/44*         (2006.01)
(52) U.S. Cl.
CPC .... *C23C 16/45565* (2013.01); *C23C 16/4412* (2013.01); *C23C 16/45574* (2013.01)
(58) Field of Classification Search
CPC .......... C23C 16/45565; C23C 16/4412; C23C 16/45574
USPC ....................................................... 118/715
See application file for complete search history.

(56) References Cited

U.S. PATENT DOCUMENTS

| | | | | |
|---|---|---|---|---|
| 5,950,925 | A | * | 9/1999 | Fukunaga ......... C23C 16/45574 239/428 |
| 12,188,125 | B2 | * | 1/2025 | Hotta ................... C23C 16/4412 |
| 2009/0250334 | A1 | * | 10/2009 | Qiu .................... H01J 37/32119 156/345.48 |
| 2014/0090599 | A1 | * | 4/2014 | Saitou ..................... B05B 1/005 118/728 |
| 2015/0187593 | A1 | * | 7/2015 | Narushima ......... H01L 21/6708 438/735 |
| 2015/0267298 | A1 | * | 9/2015 | Saitou ............... C23C 16/45544 118/725 |
| 2016/0177445 | A1 | * | 6/2016 | Takahashi ......... C23C 16/45591 118/728 |
| 2017/0372914 | A1 | * | 12/2017 | Yamashita .......... H01J 37/3244 |

(Continued)

FOREIGN PATENT DOCUMENTS

| | | |
|---|---|---|
| JP | 2005-303292 | 10/2005 |
| JP | 2014-070249 | 4/2014 |
| KR | 10-2016-0076459 | 6/2016 |

*Primary Examiner* — Charlee J. C. Bennett
(74) *Attorney, Agent, or Firm* — IPUSA, PLLC

(57)                ABSTRACT

A showerhead includes a shower plate and a base member including a gas flow path, the base member fixing the shower plate. The showerhead includes gas supply members disposed at a gas diffusion space, the gas diffusion space being provided between the shower plate and the base member, the gas supply members being connected to the gas flow path, each of the gas supply members including outlets via which gas is radially discharged, and the gas supply members being arranged such that the gas discharged via the outlets of the gas supply members generates a rotational flow.

7 Claims, 5 Drawing Sheets

(56) References Cited

U.S. PATENT DOCUMENTS

| | | | | |
|---|---|---|---|---|
| 2018/0112309 A1* | 4/2018 | Kamio | ............. | C23C 16/45544 |
| 2018/0171478 A1* | 6/2018 | Kakegawa | ........ | C23C 16/45565 |
| 2018/0274098 A1* | 9/2018 | Takagi | ............. | H01L 21/02271 |

* cited by examiner

SHOWERHEAD AND SUBSTRATE PROCESSING APPARATUS

CROSS-REFERENCE TO RELATED APPLICATIONS

This patent application claims priority to Japanese Patent Application No. 2021-097606, filed Jun. 10, 2021, the contents of which are incorporated herein by reference in their entirety.

TECHNICAL FIELD

The present invention relates to a showerhead and a substrate processing apparatus.

BACKGROUND

Patent Document 1 discloses a deposition apparatus. The deposition apparatus includes (i) a stage that is provided in a processing chamber and in which a substrate is mounted, (ii) a ceiling provided facing the stage, the ceiling including a structure having an inclined surface shape that expands from the center to an outer circumference of the ceiling, (iii) gas supplies provided in a central region of the ceiling, each gas supply having gas outlets that are formed along a circumferential direction of the ceiling, (iv) a showerhead provided so as to cover lower sides of the gas supplies, the showerhead having gas outlets at a showerhead surface facing the stage, and (v) an exhaust device that vacuum evacuates an interior of the processing chamber. The outer periphery of the showerhead is positioned inward with respect to an outer edge of the substrate that is mounted on the stage.

Patent Document 2 discloses a thin-film forming apparatus. In the thin-film forming apparatus, a gas dispersion nozzle is provided between a shower plate and an upper lid, and gas that is introduced into a gas line is dispersed via the gas dispersion nozzle, passes a gas outlet passing through the shower plate, and then is supplied onto a substrate.

RELATED-ART DOCUMENT

Patent Document

[Patent Document 1] Japanese Unexamined Patent Application Publication No. 2014-70249
[Patent Document 2] Japanese Unexamined Patent Application Publication No. 2005-303292

SUMMARY

In one aspect of the present disclosure, a showerhead includes a shower plate and a base member including a gas flow path, the base member fixing the shower plate. The showerhead includes gas supply members disposed at a gas diffusion space, the gas diffusion space being provided between the shower plate and the base member, the gas supply members being connected to the gas flow path, each of the gas supply members including outlets via which gas is radially discharged, and the gas supply members being arranged such that the gas discharged via the outlets of the gas supply members generates a rotational flow.

DETAILED DESCRIPTION

One or more embodiments of the present disclosure will be described below with reference to the drawings. In each drawing, the same components are denoted by the same numerals, and accordingly, duplicative description thereof may be omitted.

<Substrate Processing Apparatus>

Figure 1:
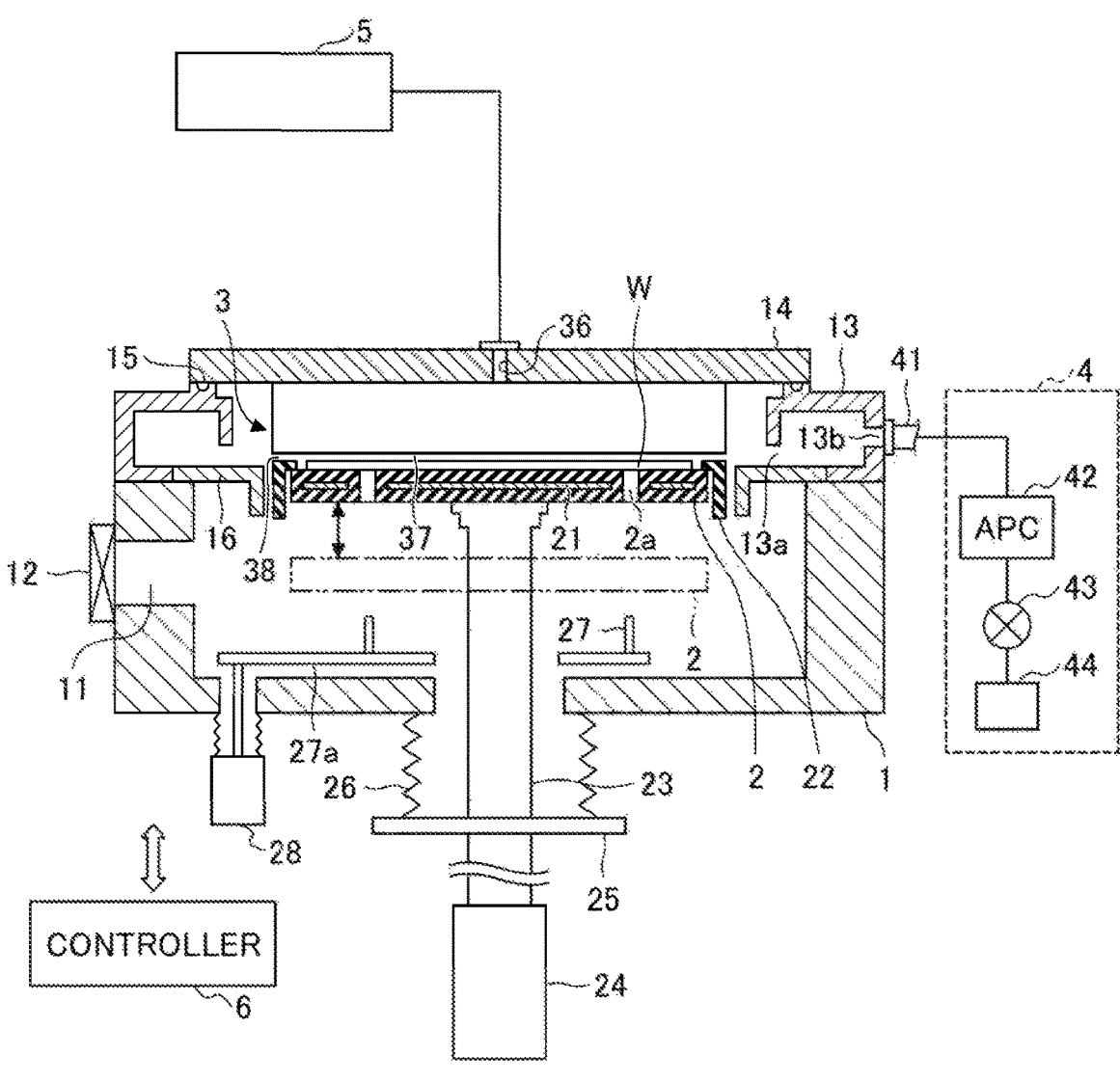
FIG. 1 is a schematic cross-sectional view of an example of a substrate processing apparatus according to the present embodiment.
Figure 2:
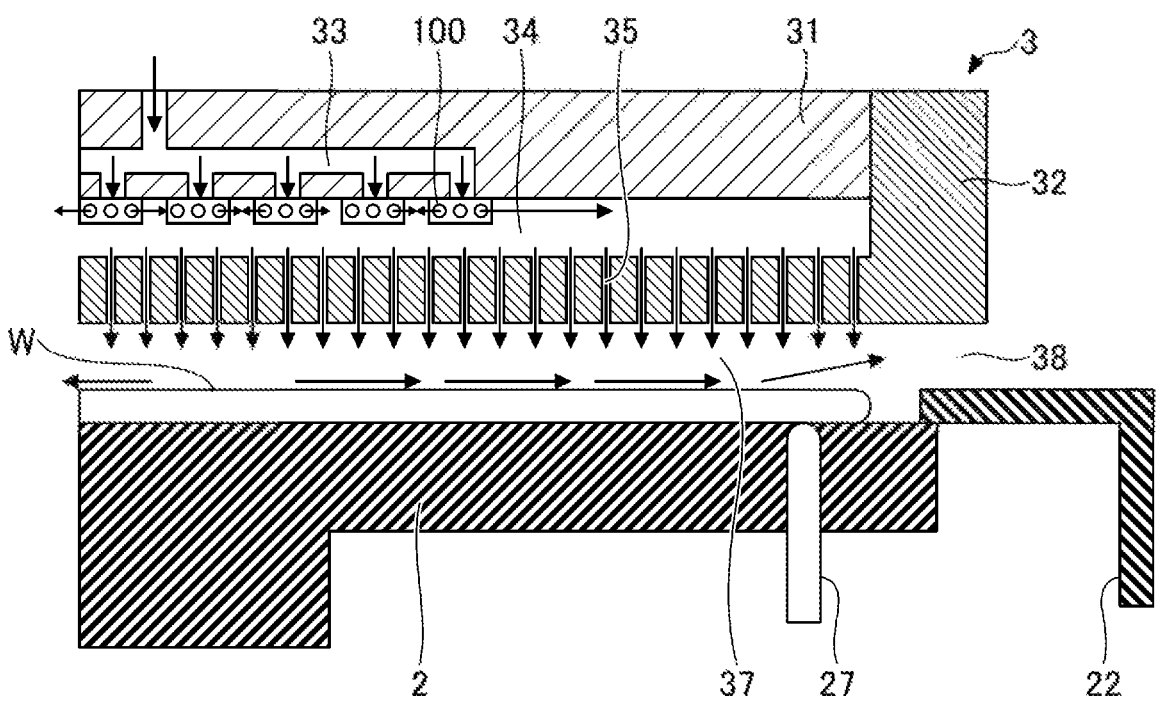
FIG. 2 is a schematic cross-sectional view of an example of the structure of a showerhead of the substrate processing apparatus according to the present embodiment.

Hereafter, a substrate processing apparatus according to the present embodiment will be described with reference to FIG. 1 and FIG. 2. FIG. 1 is a schematic cross-sectional view of an example of the substrate processing apparatus according to the present embodiment. FIG. 2 is a schematic cross-sectional view of an example of the structure of a showerhead 3 of the substrate processing apparatus according to the present embodiment.

The substrate processing apparatus is an apparatus that deposits a tungsten film, which is a metal film, on a surface of a substrate W by supplying (i) $WCl_5$ gas as a source gas and (ii) $H_2$ gas as reaction gas to the substrate W such as a wafer. The substrate processing apparatus may be, for example, implemented by an atomic layer deposition (ALD) apparatus or the like.

As illustrated in FIG. 1 and FIG. 2, the substrate processing apparatus includes a processing chamber 1, a substrate stage (stage) 2, the showerhead 3, an exhaust device 4, a gas supply mechanism 5, and a controller 6.

The processing chamber 1 is made of a metal such as aluminum, and has an approximately cylindrical shape. A loading port 11 used to load or unload the substrate W is formed at a given sidewall of the processing chamber 1. The loading port 11 can be open or closed via a gate valve 12. An annular exhaust duct 13 of which the cross section is rectangular is provided at an upper side of a main body of the processing chamber 1. A slit 13a is formed along an inner peripheral surface of the exhaust duct 13. An exhaust port 13b is formed at an outer wall of the exhaust duct 13. A top wall 14 is provided on the upper surface of the exhaust duct 13 so as to close a top opening of the processing chamber 1. A portion between the top wall 14 and the exhaust duct 13 is hermetically sealed by a seal ring 15. A compartment member 16 partitions an interior of the processing chamber 1 into an upper interior and a lower interior, when the substrate stage 2 (and a cover member 22) are raised to a processing position described below.

The substrate stage 2 supports the substrate W in the processing chamber 1 such that the substrate W is maintained horizontally. The substrate stage 2 has a disk like shape of which the size corresponds to the substrate W, and is supported by a support member 23. The substrate stage 2 is made of (i) a ceramic material such as aluminum nitride (AlN) or (ii) a metallic material such as aluminum or a nickel-based alloy. A heater 21 that heats the substrate W is embedded in an interior of the substrate stage 2. The heater 21 is powered by a heater power source (not illustrated) and generates heat. The output of the heater 21 is controlled based on a temperature signal from a thermocouple (not illustrated) that is provided proximal to a substrate mounting surface that is an upper surface of the substrate stage 2. With this arrangement, the substrate W is adjusted to a predetermined temperature.

The cover member 22, which is made of a ceramic such as alumina, is provided in the substrate stage 2 so as to cover (i) an outer peripheral region of the substrate mounting surface and (ii) a side surface of the substrate stage 2.

The support member 23 downwardly extends from a central bottom surface of the substrate stage 2, through a hole formed in a bottom wall of the processing chamber 1. In this case, a lower end of the support member 23 is situated below the processing chamber 1 and is connected to a lifting mechanism 24. The substrate stage 2 can be raised and lowered by the lifting mechanism 24, via the support member 23. With this arrangement, the substrate stage 2 can move between a processing position, as indicated by the solid line in FIG. 1, and a transfer position as indicated by the double-dotted line in FIG. 1. The transfer position, at which the substrate W can be transferred to a given location, is lower than the processing position, as expressed by the double-dotted line in FIG. 1. A collar 25 is attached to the support member 23, below the processing chamber 1. A bellows 26 is provided between the bottom wall of the processing chamber 1 and the collar 25, and is used to segregate an atmosphere of the processing chamber 1 from ambient air. The bellows 26 expands and contracts in accordance with lowering and raising of the substrate stage 2, respectively.

In proximity of the bottom surface of the processing chamber 1, three substrate support pins 27 (only two pins are illustrated) are provided to protrude upwardly from a lifting plate 27a. The substrate support pins 27 can be raised or lowered, via the lifting plate 27a, by a lifting mechanism 28 that is provided below the processing chamber 1. With this arrangement, each substrate support pin 27 is inserted through a through hole 2a provided in the substrate stage 2 that is at the transfer position, and thus can protrude from the upper surface of the substrate stage 2. Also, each substrate support pin 27 can be retracted from the upper surface of the substrate stage 2. In such a manner, by raising or lowering the substrate support pins 27, the substrate W is transferred between a substrate transfer mechanism (not illustrated) and the substrate stage 2.

The showerhead 3 supplies process gas to the processing chamber 1 such that the process gas is showered. The showerhead 3 is made of metal and is provided facing the substrate stage 2. A gas supply path 36 that is connected to the showerhead 3 (gas supply path 33 described below) is provided in the top wall 14.

When the substrate stage 2 is at the processing position, a process space 37 is formed between the showerhead 3 (shower plate 32 described below) and the substrate stage 2, and thus the showerhead 3 (shower plate 32 described below) and the upper surface of the cover member 22 in the substrate stage 2 become close to each other so that an annular space 38 is formed.

The exhaust device 4 evacuates the interior of the processing chamber 1. The exhaust device 4 includes an exhaust line 41 connected to the exhaust port 13b of the exhaust duct 13. The exhaust device 4 also includes an auto pressure controller (APC) valve 42, an on-off valve 43, and a vacuum pump 44. The exhaust line 41 is connected, at one end, to the exhaust port 13b of the exhaust duct 13, and another end is connected to an intake port of the vacuum pump 44. In sequential order from upstream, the APC valve 42 and the on-off valve 43 are provided between the exhaust duct 13 and the vacuum pump 44. The APC valve 42 regulates conductance of an exhaust path to adjust pressure of the process space 37. The on-off valve 43 switches opening and closing of the exhaust line 41. In a process, the compartment member 16 and the substrate stage 2 (cover member 22) partition the interior of the processing chamber 1 into an upper space including the process space 37 and a lower space provided on a rear side of the substrate stage 2. With this arrangement, the gas in the process space 37 reaches the annular space of the exhaust duct 13, through the annular space 38 and the slit 13a. Then, a vacuum pump 44 in the exhaust device 4 is used to exhaust the gas via the exhaust port 13b of the exhaust duct 13 and the exhaust line 41. The lower space is maintained at a purged atmosphere by a purge gas supply mechanism (not illustrated). With this arrangement, the gas in the process space 37 does not flow into the lower space.

The gas supply mechanism 5 supplies the source gas, reaction gas, and purge gas, to the gas supply path 36. In the following description, the source gas is $WCl_5$, the reaction gas is $H_2$, and the purge gas is $N_2$. The gas supplied to the gas supply path 36 is supplied from the showerhead 3 to the process space 37.

The controller 6 controls the operation of each component of the substrate processing apparatus. The controller 6 includes a central processing unit (CPU), a read only memory (ROM), and a random access memory (RAM). The CPU performs a desired process in accordance with a recipe that is stored in a storage area such as the RAM. The recipe includes control information for the apparatus, in association with a process condition. The control information may include, for example, a gas flow rate, pressure, temperature, and a processing time period. A program that is used by the recipe and the controller 6 may be stored in, for example, a hard disk or a semiconductor memory. When the recipe or the like is set at a predetermined location in a portable computer-readable storage medium, such as a CD-ROM, a DVD, or the like, it may be retrieved from the computer-readable storage medium.

The controller 6 repeats (i) a step of supplying a source gas, (ii) a first supplying step of purge gas, (iii) a step of supplying reaction gas, and (iv) a second supplying step of the purge gas, in order to deposit a tungsten film on the substrate W.

In the step of supplying the source gas, the controller 6 controls the gas supply mechanism 5 to supply source gas ($WCl_5$) to the process space 37. In this step, the surface of the substrate W absorbs the source gas.

In the first supplying step of the purge gas, the controller 6 controls the gas supply mechanism 5 to supply purge gas ($N_2$) to the process space 37. In this step, excess source gas and the like in the processing space 37 are purged.

In the step of supplying the reaction gas, the controller 6 controls the gas supply mechanism 5 to supply reaction gas ($H_2$) to the process space 37. In this step, the reaction gas reacts with the source gas adsorbed into the surface of the substrate W, and thus the tungsten film is deposited on the surface of the substrate W.

In the second supplying step of the purge gas, the controller 6 controls the gas supply mechanism 5 to supply the purge gas ($N_2$) to the process space 37. In this step, excess reaction gas and the like in the process space 37 are purged.

As described above, (i) the step of supplying the source gas, (ii) the first supplying step of the purge gas, (iii) the step of supplying the reaction gas, and (iv) the second supplying step of the purge gas are repeated a predetermined number of times, and thus the tungsten film is deposited on the substrate W.

<Structure of Showerhead>

Figure 3:
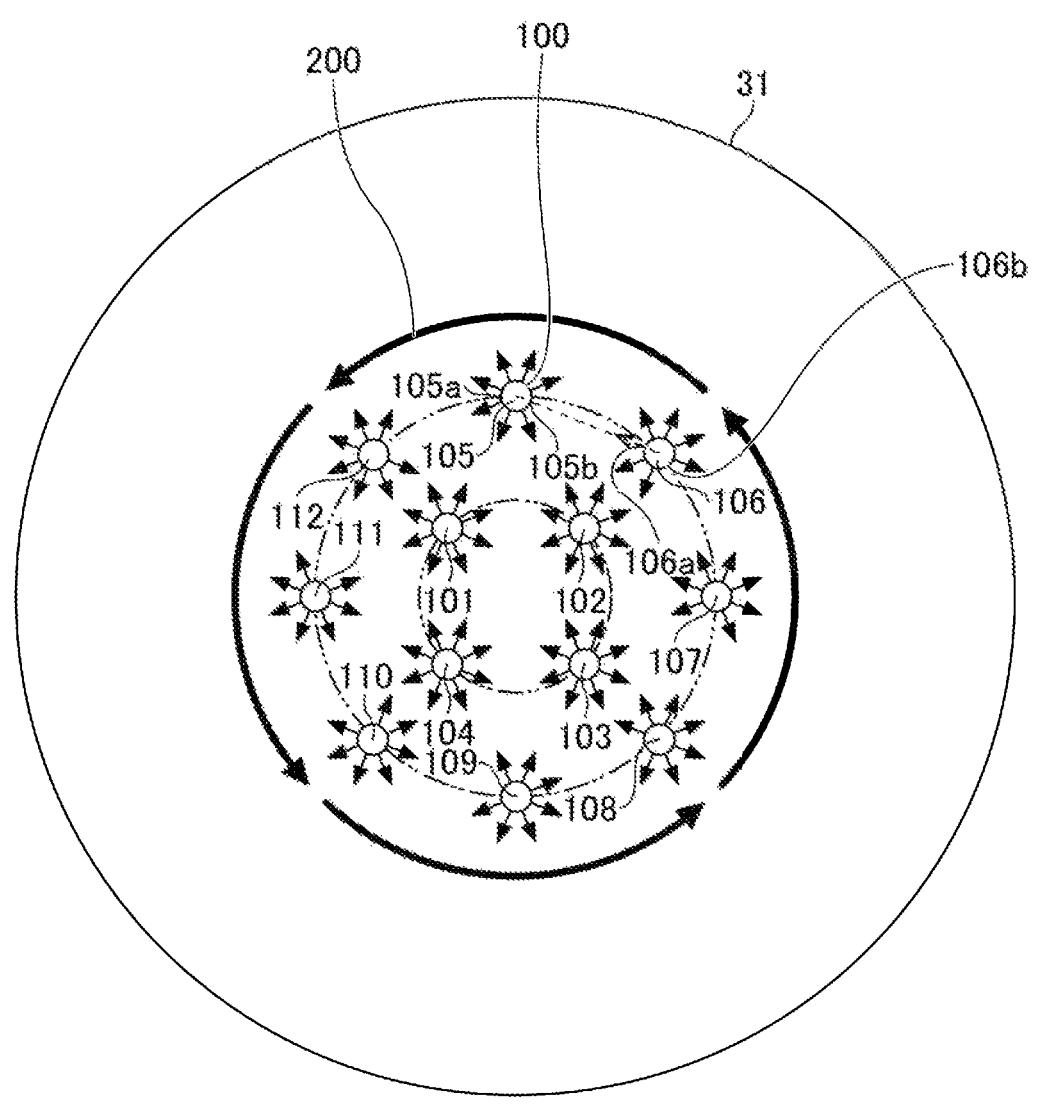
FIG. 3 is a plan view of an example of the structure of the showerhead of the substrate processing apparatus according to the present embodiment.

Hereafter, the structure of the showerhead 3 will be further described with reference to FIG. 2. FIG. 2 is a schematic cross-sectional view of an example of the structure of the showerhead 3 of the substrate processing apparatus according to the present embodiment. FIG. 3 is a plan view of an example of the structure of the showerhead 3 of the substrate processing apparatus according to the present embodiment. In FIG. 2 and FIG. 3, gas flows are expressed by arrows.

The showerhead 3 includes a base member 31 that is fixed to the top wall 14 of the processing chamber 1, and includes the shower plate 32 connected to the base member 31. Most of the shower plate 32 is disposed lower than the base member 31. The base member 31 is connected, at an upstream side, to the gas supply path 36 (see FIG. 1), and a downstream side of the gas supply path 33 branches into path segments. A gas diffusion space 34 is formed between the base member 31 and the shower plate 32. Gas discharge holes 35 are formed at a flat surface of the shower plate 32. The gas supplied via the gas supply path 36 (see FIG. 1) sequentially flows into the gas supply path 33, the gas diffusion space 34, and the gas discharge holes 35. Then, the gas is supplied to the process space 37. Subsequently, the gas in the process space 37 is exhausted, via the annular space 38, to reach the exhaust duct 13 (see FIG. 1).

Gas supply members (gas supply member) 100 are provided at the gas diffusion space 34.

The gas supply members 100 are respectively connected to the lower ends of the branched path segments of the gas supply path 33. Each gas supply member 100 has a hollow cylindrical shape. The upper side of the gas supply member 100 has an opening (not illustrated), and a hollow space of the gas supply member 100 communicates with the gas supply path 33. The bottom surface of the gas supply member 100 is closed. The side surface (circumferential surface) of each gas supply member 100 includes outlets via which gas is discharged horizontally. With this arrangement, the gas supplied via the gas supply path 36 (see FIG. 1) is supplied via the gas supply path 33 to the gas supply members 100, and then is horizontally supplied to the gas diffusion space 34 via the outlets of the gas supply members 100. The path segments, into which the gas supply path 33 branches, are each formed such that a path length from the gas supply path 36 to a corresponding gas supply member 100 is the same.

As illustrated in FIG. 3, the gas supply members 100 include (i) four gas supply members (inner gas supply members) 101 to 104, which are equally spaced from one another on the circumference (as expressed by the double dotted line) of a given circle, and (ii) eight gas supply members 105 to 112, which are equally spaced from one another, on the circumference (as expressed by the double dotted line) of a given circle. The gas supply members 105 to 112 are equiangularly concentrically spaced from one another about the center of the base member 31. The gas supply members 101 to 104 are disposed inwardly with respect to the gas supply members 105 to 112, and are equiangularly concentrically spaced from one another about the center of the base member 31.

In FIG. 3, directions of the gas discharged by the gas supply members 100 (101 to 112) are expressed by arrows.

Each of the gas supply members 101 to 104 includes eight outlets, and the gas is discharged radially via the outlets, in a plan view. The eight outlets of each of the gas supply members 101 to 104 are equiangularly circumferentially spaced about the gas supply member. The eight outlets are formed to have the same diameter. Also, the same combination of eight discharge directions is applied to each of the gas supply members 101 to 104. With this arrangement, uniformity of film deposition that is performed proximal to the center of the substrate W can be improved.

Each of the gas supply members 105 to 112 includes seven outlets, and the gas is discharged radially via the outlets, in a plan view. The seven outlets are respectively oriented in seven directions among eight directions that are determined when circumferentially disposed eight outlets are equally spaced about the center of a given gas supply member. The seven outlets are formed to have the same diameter.

For each of the gas supply members 105 to 112 that are arranged annularly, one outlet of the gas supply member is provided facing the center of one adjacent gas supply member, while an outlet is not provided facing the center of the other adjacent gas supply member. Specifically, an outlet 105a is provided at the side surface of the gas supply member 105 that is directed to a direction from the center of the gas supply member 105 toward the center of one adjacent gas supply member 112, while an outlet is not provided at a side surface 105b of the gas supply member 105 that is directed to a direction from the center of the gas supply member 105 toward the center of the other adjacent gas supply member 106. Further, an outlet 106a is provided at the side surface of the gas supply member 106 that is directed to a direction from the center of the gas supply member 106 toward the center of one adjacent gas supply member 105, while an outlet is not provided at a side surface 106b of the gas supply member 106 that is directed to a direction from the center of the gas supply member 106 toward the center of the other adjacent gas supply member 107. With this arrangement, on a line (as expressed by a dashed line in FIG. 3) connecting the center of the gas supply member 105 with the center of the adjacent gas supply member 106, gases are prevented from flowing across each other. Therefore, a region where gas pressure is increased can be prevented from occurring.

Likewise, for the gas supply member 107, one outlet is provided at the side surface of the gas supply member that is directed to a direction from the center of the gas supply member 107 toward the center of one adjacent gas supply member 106, while an outlet is not provided at the side surface of the gas supply member 107 that is directed to a direction from the center of the gas supply member 107 toward the center of the other adjacent gas supply member 108. Also, one outlet is provided at the side surface of the gas supply member 108 that is directed to a direction from the center of the gas supply member 108 toward the center of one adjacent gas supply member 107, while an outlet is not provided at the side surface of the gas supply member 108 that is directed to a direction from the center of the gas supply member 108 toward the center of the other adjacent gas supply member 109. For the gas supply member 109, one outlet is provided at the side surface of the gas supply member that is directed to a direction from the center of the gas supply member 109 toward the center of one adjacent gas supply member 108, while an outlet is not provided at the side surface of the gas supply member 109 that is directed to a direction from the center of the gas supply member 109 toward the center of the other adjacent gas supply member 110. For the gas supply member 110, one outlet is provided at the side surface of the gas supply member that is directed to a direction from the center of the gas supply member 110 toward the center of one adjacent gas supply member 109, while an outlet is not provided at the side surface of the gas supply member 110 that is directed to a direction from the center of the gas supply member 110 toward the center of the other adjacent gas supply member 111. For the gas supply member 111, one outlet is provided at the side surface of the gas supply member that is directed to a direction from the center of the gas supply member 111 toward the center of one adjacent gas supply member 110, while an outlet is not provided at the side surface of the gas supply member 111 that is directed to a direction from the center of the gas supply member 111 toward the center of the other adjacent gas supply member 112. For the gas supply member 112, one outlet is provided at the side surface of the gas supply member that is directed to a direction from the center of the gas supply member 112 toward the center of one adjacent gas supply member 111, while an outlet is not provided at the side surface of the gas supply member 112 that is directed to a direction from the center of the gas supply member 112 toward the center of the other adjacent gas supply member 105. With this arrangement, on a line connecting the center of each gas supply member with the center of a given adjacent gas supply member, gases are prevented from flowing across each other. Therefore, a region where gas pressure is increased can be prevented from occurring.

One direction, among eight direction that are determined when circumferentially disposed eight outlets are equally spaced about the center of the gas supply member, is not applied to the seven outlets of the gas supply member 105, and the seven outlets have the same opening diameter. With this arrangement, the sum of vector components of gas discharged via the seven outlets of the gas supply member 105 includes a circumferential component that is obtained circumferentially about the center of the base member 31. In the example in FIG. 3, the sum of the vector components of the gas that is discharged by the gas supply member 105 includes a circumferential component in a counterclockwise direction. Also, the sum of the vector components of the gas discharged by the gas supply member 105 includes a radial component that is obtained outwardly from the center of the base member 31. Likewise, the sum of vector components of the gas discharged by each of the gas supply members 106 to 112 includes a circumferential component in a counter-clockwise direction, as well as including a radial component that is obtained outwardly from the center of the base member. In other words, for vector components obtained for each of the gas supply members 105 to 112, a given circumferential component in the same direction (in the example in FIG. 3, the counterclockwise direction) is included. With this arrangement, the gas discharged via the outlets of the gas supply members 105 to 112 generates a counterclockwise rotational flow 200.

In contrast, the eight outlets of the gas supply member 101 are equiangularly circumferentially spaced about the center of the gas supply member, and have the same opening diameter. With this arrangement, the sum of vector components of the gas discharged via the eight outlets of the gas supply member 101 is zero. Likewise, the sum of vector components of the gas discharged by each of the gas supply members 102 to 104 is zero.

Figure 4:
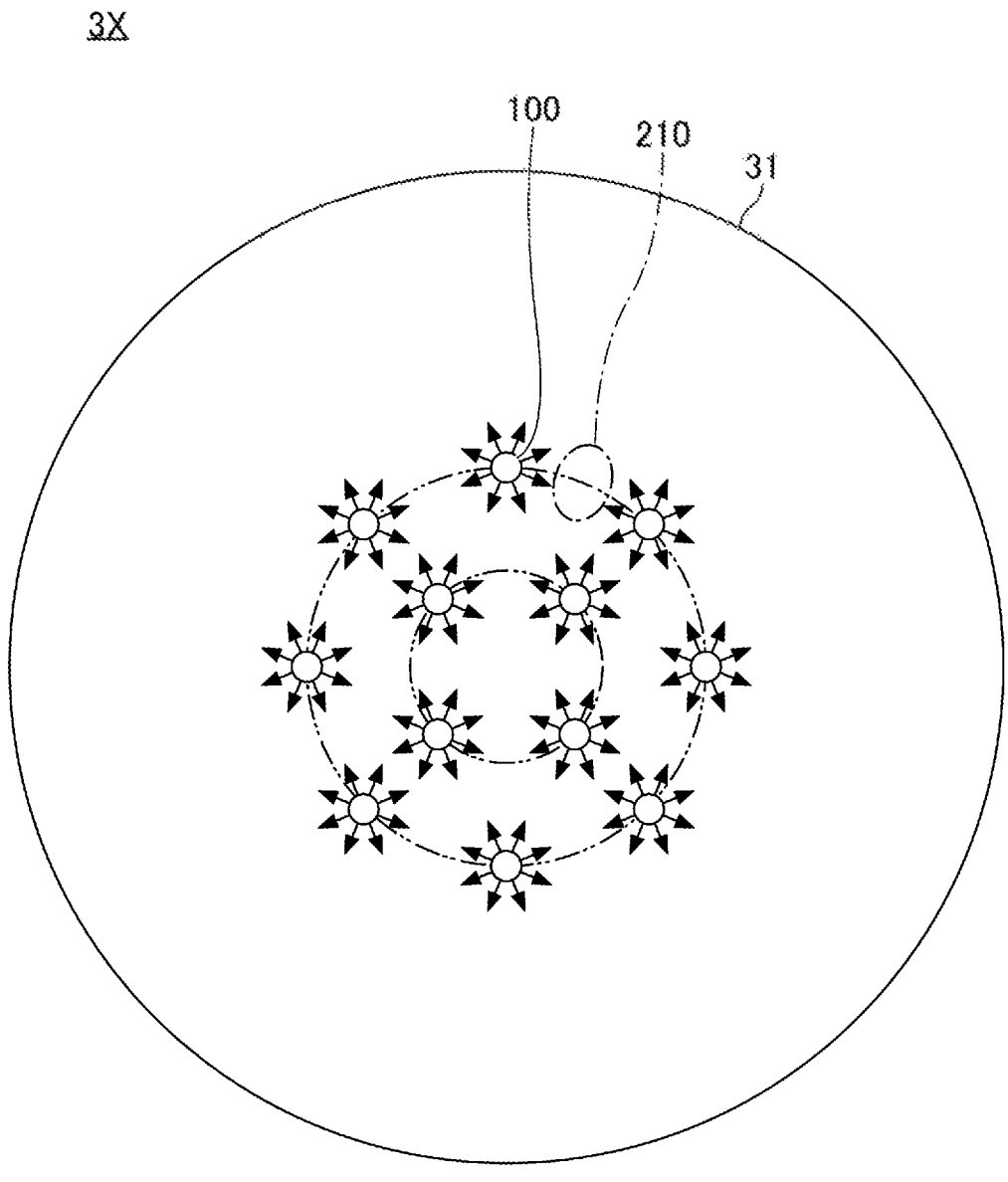
FIG. 4 is a plan view of the structure of the showerhead of the substrate processing apparatus in a reference example.

Hereafter, the structure of a showerhead 3X of the substrate processing apparatus in a reference example will be described with reference to FIG. 4. FIG. 4 is an example of a plan view of an example of the structure of the showerhead 3X of the substrate processing apparatus in the reference example.

The structure (see FIG. 4) of the showerhead 3X of the substrate processing apparatus in the reference example differs from the structure (see FIG. 3) of the showerhead 3 of the substrate processing apparatus according to the present embodiment, in the structure of each of given gas supply members 100. Specifically, for all gas supply members 100, eight outlets are equiangularly circumferentially spaced about the center of the gas supply member. Other configurations are the same as those described in the embodiment, and accordingly, duplicate description thereof is omitted.

The showerhead 3X includes regions 210 where collision of gases discharged by adjacent gas supply members 100 occurs.

Figure 5:
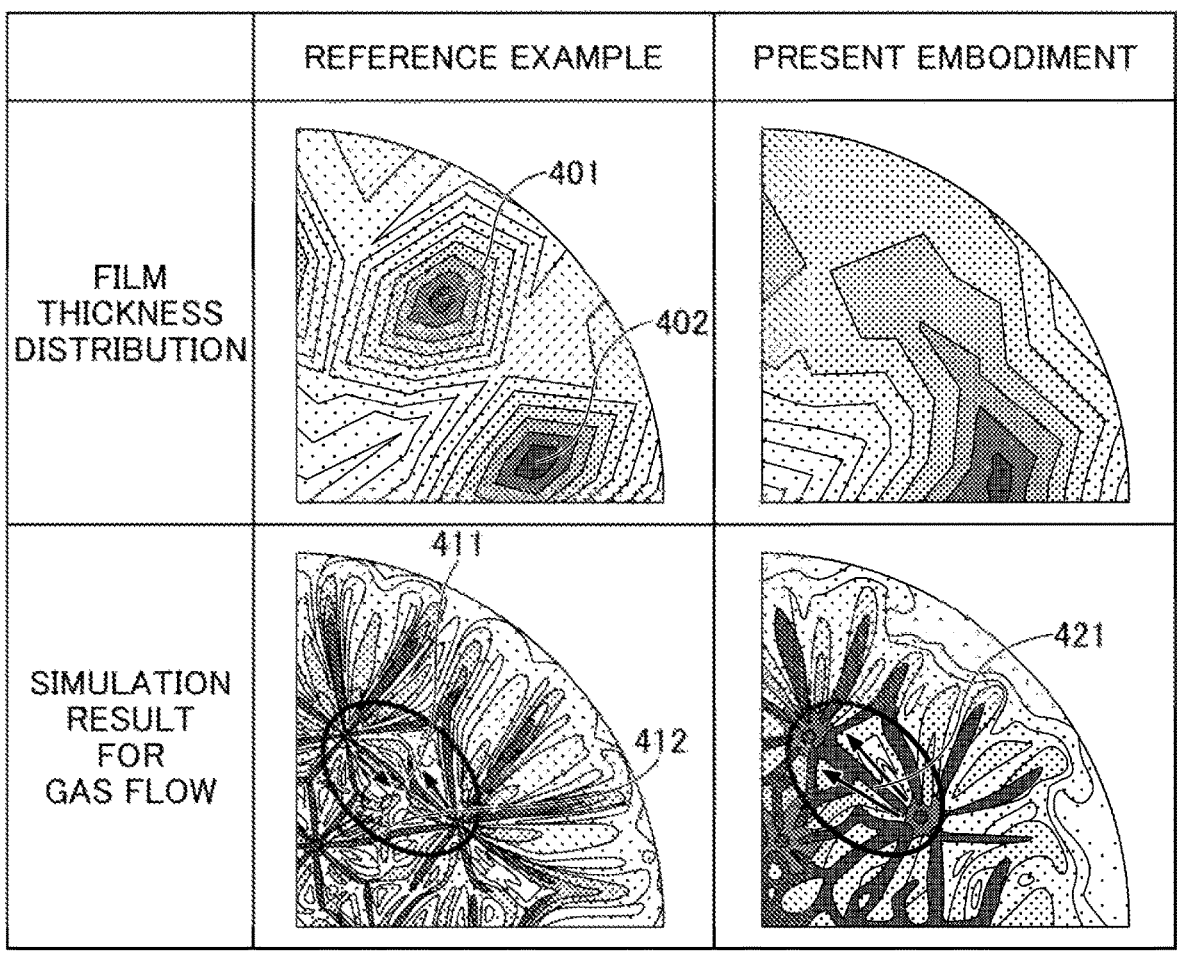
FIG. 5 is a diagram illustrating an example of in-plane distribution of a film thickness and a gas flow rate, with respect to each of the reference example and the present embodiment.

The effect of the showerhead 3 of the substrate processing apparatus according to the present embodiment will be described in comparison to the showerhead 3X of the substrate processing apparatus in the reference example. FIG. 5 is a diagram illustrating an example of film thickness distribution and a gas flow rate, with respect to each of the reference example and the present embodiment.

In FIG. 5, with use of each of (i) the substrate processing apparatus with the showerhead 3 (see FIG. 3) according to the present embodiment and (ii) the substrate processing apparatus with the showerhead X3 (see FIG. 4) in the reference example, a tungsten film is deposited on the substrate W. The film thickness distribution is expressed by dotted shading. A thicker film portion is indicated with dense dotting, and a thinner film portion is indicated with sparse dotting. Further, in each of the substrate processing apparatus according to the present embodiment and the substrate processing apparatus in the reference example, gas flow rates at which the gas is discharged by gas supply members 100 are simulated. Simulation results of the gas flow rates are indicated with dotted shading. An increased gas flow rate is indicated with dense dotting, and a reduced gas flow rate is indicated with sparse dotting.

In the structure (see FIG. 4) of the showerhead 3X of the substrate processing apparatus in the reference example, as illustrated in the simulation results of the flow rates, a location 411 where the flow rate is reduced due to collision (see arrows) of gases that flow between a given gas supply member 100 and one adjacent gas supply member 100, is obtained, and the gases are discharged by the given gas supply member 100 and the one adjacent gas supply member 100. Further, a location 412 where the flow rate is reduced, while the gas discharged from a given inner gas supply member 100 is flowing toward the outer peripheral side (of the exhaust duct 13), is obtained. In such a manner, as illustrated in the film thickness distribution in the reference example, a region in which the film thickness is increased is obtained at each of locations 401 and 402 where gases discharged by given gas supply members 100 meet. In other words, in the region 210 (see FIG. 4) where the discharged gases by a given gas supply member 100 and one adjacent gas supply member 100 collide, a region where the film thickness is increased is obtained. In the reference example, the film thickness, as expressed by $1\sigma/\text{Ave}$ (which is a value that is obtained by dividing standard deviation by an average film thickness) is 6.1%.

In contrast, in the structure (see FIG. 3) of the showerhead 3 in the substrate processing apparatus according to the present embodiment, the rotational flow 200 (see FIG. 3) is generated. With this arrangement, at the location 421 between the gas supply member 105 and the adjacent gas supply member 106, the gas flows in one direction (direction from the gas supply member 106 toward the gas supply member 105), as illustrated in the simulation results of the flow rates. Therefore, as illustrated in the film thickness distribution according to the present embodiment, uniformity of the film thickness is improved. In the present embodiment, the film thickness given by 1σ/Ave is 2.9%, and uniformity of the film thickness is improved in comparison to the reference example.

As described above, by providing the gas supply members 100, in-plane uniformity of the tungsten film deposited on the substrate W can be improved.

While certain embodiments have been described using the substrate processing apparatus, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

In one aspect of the present disclosure, a showerhead and a substrate processing apparatus that improves in-plane distribution of a film thickness can be provided.

What is claimed is:

1. A showerhead comprising:
a shower plate;
a base member including a gas flow path, the base member fixing the shower plate; and
gas supply members disposed at a gas diffusion space, the gas diffusion space being provided between the shower plate and the base member, the gas supply members being connected to the gas flow path,
wherein each of the gas supply members includes:
a circumferential side surface including outlets configured to discharge gas radially, and
a bottom surface closing one end of the circumferential side surface, wherein the gas supply members include:
one or more first gas supply members arranged in an inner concentric ring, and a plurality of second gas supply members in an outer concentric ring,
wherein the circumferential side surface of each of the plurality of second gas supply members includes:
a first surface region that faces an adjacent second gas supply member, the first surface region having no outlet, and
a second surface region including the outlets that are arranged at regular intervals in a circumferential direction of the circumferential side surface except for the first surface region, and
wherein the plurality of second gas supply members are arranged such that the gas discharged via the outlets of the second gas supply members generates a rotational flow.

2. The showerhead according to claim 1, wherein the sum of vector components of the gas discharged by the plurality of second gas supply members includes a component that is obtained circumferentially about a center of the base member.

3. The showerhead according to claim 1, wherein the first gas supply members and the plurality of second gas supply members are arranged concentrically about a center of the base member.

4. The showerhead according to claim 1,
wherein the sum of vector components of the gas discharged by the first gas supply members is zero.

5. The showerhead according to claim 4, wherein the first gas supply members are arranged concentrically about a center of the base member, and
wherein a same combination of discharge directions of the gas is applied to each of the first gas supply members.

6. The showerhead according to claim 4, wherein each of the first gas supply members includes eight gas outlets, and
wherein each of the plurality of second gas supply members includes seven gas outlets.

7. A substrate processing apparatus comprising the showerhead of claim 1.

* * * * *